(12) United States Patent
Layyous et al.

(10) Patent No.: US 8,703,245 B2
(45) Date of Patent: Apr. 22, 2014

(54) COATED CUTTING TOOL, CUTTING MEMBER OR WEAR PART

(71) Applicants: Iscar, Ltd., Tefen (IL); Ionbond AG Olten, Olten (CH)

(72) Inventors: Albir Layyous, Me'ilya (IL); Yehezkeal Landau, Nahariya (IL); Hristo Strakov, Olten (CH); Renato Bonetti, Winznau (CH)

(73) Assignees: Iscar, Ltd., Tefen (IL); Ionbond AG, Olten (CH)

( * ) Notice: Subject to any disclaimer, the term of this patent is extended or adjusted under 35 U.S.C. 154(b) by 0 days.

(21) Appl. No.: 13/727,175

(22) Filed: Dec. 26, 2012

(65) Prior Publication Data

US 2013/0115018 A1    May 9, 2013

Related U.S. Application Data (62) Division of application No. 12/099,468, filed on Apr. 8, 2008, now abandoned.

(30) Foreign Application Priority Data

Apr. 23, 2007 (IL) .......................... 182741

(51) Int. Cl.
*C23C 16/04* (2006.01)
(52) U.S. Cl.
USPC .............. 427/419.7; 427/255.23; 427/255.27; 427/255.28; 427/255.31; 427/255.32; 427/255.36; 427/255.39; 427/255.391; 427/255.393; 427/419.1
(58) Field of Classification Search
USPC .................. 427/255, 255.23, 255.27, 255.28, 427/255.31, 255.32, 255.36, 255.39, 427/255.391, 255.393, 419.1, 419.7
See application file for complete search history.

(56) References Cited

U.S. PATENT DOCUMENTS

| | | |
|---|---|---|
| 4,803,127 A | 2/1989 | Hakim |
| 4,943,450 A | 7/1990 | Sarin |
| 5,208,102 A | 5/1993 | Schulz et al. |
| 5,264,245 A | 11/1993 | Punola et al. |
| 5,981,049 A | 11/1999 | Ohara et al. |
| 6,007,909 A | 12/1999 | Rolander et al. |
| 6,673,430 B2 | 1/2004 | Schiller et al. |
| 6,767,658 B2 | 7/2004 | Yamamoto et al. |
| 6,811,899 B2 | 11/2004 | Inoue |
| 6,824,601 B2 | 11/2004 | Yamamoto et al. |

(Continued)

FOREIGN PATENT DOCUMENTS

| | | |
|---|---|---|
| DD | 288628 A5 | 4/1991 |
| EP | 0117542 | 9/1984 |

(Continued)

OTHER PUBLICATIONS

International Search Report dated Jul. 15, 2009 issued in PCT counterpart application (No. PCT/IL2008/000461).

(Continued)

*Primary Examiner* — Archene Turner
(74) *Attorney, Agent, or Firm* — Womble Carlyle (57) ABSTRACT

A coated metal substrate has at least one layer of titanium based hard material alloyed with at least one alloying element selected from the list of chromium, vanadium and silicon. The total quantity of alloying elements is between 1% and 50% of the metal content, the layer having a general formula of: $(Ti_{100-a-b-c}Cr_aV_bSi_c)C_xN_yO_z$.

21 Claims, 7 Drawing Sheets

(56) References Cited

U.S. PATENT DOCUMENTS

| | | |
|---|---|---|
| 7,060,345 B2 | 6/2006 | Fukui et al. |
| 7,211,138 B2 | 5/2007 | Yamamoto et al. |
| 7,258,912 B2 | 8/2007 | Yamamoto et al. |
| 7,410,707 B2 | 8/2008 | Fukui et al. |
| 2003/0059632 A1 | 3/2003 | Inoue |
| 2004/0018393 A1 | 1/2004 | Fukui et al. |

FOREIGN PATENT DOCUMENTS

| | | |
|---|---|---|
| EP | 1245699 | 10/2002 |
| EP | 1382709 A1 | 1/2004 |
| JP | 54-158778 | 12/1979 |
| JP | 55 112734 | 8/1980 |
| JP | 01-123073 | 5/1989 |
| JP | 04-297568 | 10/1992 |
| JP | 07-173608 | 7/1995 |
| JP | 10-244405 | 9/1998 |
| JP | 11 152583 | 6/1999 |
| JP | 2000-144376 | 5/2000 |
| JP | 2002-307129 | 10/2002 |
| JP | 2003-071611 | 3/2003 |
| JP | 2005-262388 | 9/2005 |
| WO | WO 99/29920 | 6/1999 |

OTHER PUBLICATIONS

Office Action dated Aug. 9, 2010 issued in Chinese counterpart application (No. 200880013068.6).

Kuo, Dong-Hau et al. "A new class of Ti-Si-C-N coatings obtained by chemical vapor deposition—part I: 1000°C Process," *Thin Solid Films* (2001) vol. 394 pp. 72-80 Elsevier Science S.A., Netherlands.

Kuo, Dong-Hau et al., "A new class of Ti-Si-C-N coatings obtained by chemical vapor deposition—part II: low-temperature process," *Thin Solid Films* (2001) vol. 394 pp. 81-89 Elsevier Science S.A., Netherlands.

Kuo, Dong-Hau et al., "A new class of Ti-Si-C-N coatings obtained by chemical vapor deposition, Part III: 650-800°C process," Thin Solid Films (2002) vol. 419, pp. 11-17 Elsevier Science S.A., Netherlands.

Lee, Dong Keun et al. "Synthesis and mechanical evaluation of quaternay Ti-Cr-Si-N coatings depostied by hybrid method arc ion plating and sputtering techniques" *Surface & Coatings Tech. 200* (2005) pp. 1489-1494.

Ma, Dayan et al., "Superhard nanocomposite Ti-Si-C-N coatings prepared by pulsed-d.c plasma enhanced CVD," *Surface and Coatings Technology* (2005) vol. 200, pp. 382-386.

Mikula, J. et al. "PVD and CVD coating systems on oxide too ceramics," *JAMME* (2007) 24:2 pp. 75-78.

Quinto, D.T. et al., "Mechanical Properties, Structure and Performance of Chemically Vapor-deposited and Physically Vapor-deposited Coated Carbide Tools," *Materials Science and Engineering* (1988) pp. 443-452.

Quinto, Dennis T., "Twenty-Five Years of PVD Coatings at the Cutting Edge," From the 2007 $50^{th}$ SVC Technical Conference, *BULLETIN of Vacuum Coating Industry*, (Fall 2007) pp. 17-22.

Schultz, Barbara "It's all about the coating", *Australian Mfg. Tech,* (Aug. 2008) pp. 34-36.

Venkatesh, V.C. et al. "Performance Studies of Uncoated, CVD-Coated and PVD-Coated Carbides in Turning and Milling," *Annals of the CIRP* (1991) 40:1 pp. 545-550.

Veprek, S. et al., "A concept for the design of novel superhard coatings," *Thin Solid Films* (1995) vol. 268, pp. 64-71 Elsevier Science S.A., Germany.

COATED CUTTING TOOL, CUTTING MEMBER OR WEAR PART

RELATED APPLICATIONS

This is a Divisional of U.S. patent application Ser. No. 12/099,468, filed Apr. 8, 2008, now abandoned. The contents of the aforementioned application are incorporated by reference in their entirety.

FIELD OF THE INVENTION

The present invention is directed to providing protective coatings for general applications including cutting tools, cutting members and cutting tool bits, wear parts, thus extended working life.

BACKGROUND OF THE INVENTION

For machining work-pieces, by cutting, turning, milling, drilling and like, cutting tools are used. The cutting tools remove surplus material, henceforth chips, thereby shaping the work-piece. However, they are, themselves, worn away in the process and require replacing. There is a correlation between hardness and wear resistance. To ensure that chips are efficiently removed from the work-piece, whilst ensuring long working life of the cutting tool, the cutting tool is required to be hard and tough.

Hardness however may be correlated with brittleness however. Being both hard and tough, composite materials consisting of hard ceramic particles in a metal matrix are very popular choices for cutting tools. A number of such ceramic-metal composites or cements have been developed. The so-called hard metals consisting of tungsten carbide particles in a metal matrix such as cobalt for example, are the materials of choice for fabrication of cutting members for many applications. The term "cutting member" includes, for example, inserts, cartridges, cutting plates, solid carbides cutting heads, drills and end mills, etc.

The term "wear part" describes components used in applications where wear is a recognized problem. Wear parts may be for various wear applications such as, for example, machine parts, textile machine parts, ball bearings, roller bearings, moving parts in heat exchangers, turbo loaders, gas-turbine, exhaust valves, nozzles, manufacturing process dies for example for extrusion or wire drawing, punches, blanking tools, hot forging and pressing, molds, shear blades, plunger rods for pumps, plunger ball blanks, down hole pump check valve blanks, bushings, and other wear and impact applications.

Wear parts are commonly made of carbon steel, austenitic, ferrific or martensitic stainless steels, hot work tool steels, cold work tool steels, 51000 steels, nickel and cobalt super alloys, and high speed steel.

It will be appreciated that the wear of cutting members and wear parts takes place at their contact surfaces, and can be attributed to mechanical or friction type wear or abrasion. Abrasion of cutting tools is often enhanced by chemical attack, such as oxidization, for example, where the cutting tool material reacts with the surrounding air, and/or the work-piece and/or coolant fluids and lubricants in wet machining processes.

The downtime of cutting tools whilst the cutting members are replaced and of other applications in which wear parts are replaced is costly. Much research is directed to improving the wear resistance of such cutting tools and wear parts by application of hard and/or chemical resistant coatings to increase their working life.

Indentation hardness is a measure of resistance to plastic deformation. There is a strong correlation between indentation hardness and Mohs hardness, which indicates the relative resistance of materials to scratching. In general, the harder a material, the more abrasion resistant it is.

Since hardness is a measure of resistance to plastic deformation, unfortunately, there is a general correlation between hardness and brittleness, and the harder a material is, the more brittle it is, i.e. the more likely it is that stresses will be relieved by crack propagation instead of by plastic deformation. In consequence of the above, it is generally found that the more resistant a material is to gradual abrasion, the more it is likely to be susceptible to brittle failure. It is often found that coatings that resist slow wear tend to be susceptible to catastrophic failure modes such as thermal shock, spalling, coating delamination and the like.

The general thrust of materials science research and surface engineering for cutting tools and wear parts is to develop hard, tough (non-brittle) coatings that increase the working life of cutting tools and wear parts by providing protection on the surface against the main causes of wear: heat, chemical attack and abrasion.

Coatings may be formed on cutting members and wear parts by a range of coating technologies that are generally classified as PVD (physical vapor deposition) or CVD (chemical vapor deposition).

PVD gives very good properties and coating deposition rates are generally equivalent than those of CVD techniques. It is a feature of PVD processes that coatings can only be applied to line-of-sight areas of a substrate and cannot be applied in holes and on shielded surfaces. Residual stresses from coating deposition tend to be compressive and these stresses may cause coatings to flake off. Because of both the low deposition rates and the risk of coating failure due to the tensile internal stresses and residual stresses from the deposition process as the coating thickness increases, PVD is generally limited to thin coatings.

In contrast, CVD coatings are not restricted to line-of-sight deposition. Relatively thick coatings of several microns may be deposited and, since residual stresses may be tensile or compressive depending upon the substrate, the coatings are less susceptible to spalling. Furthermore, deposition temperatures are typically rather higher than those of PVD technologies. This facilitates the development of a diffusion-induced interface between the coating and substrate which allows good adhesion to be achieved. Indeed, good adhesion is one of the critical requirements for the coatings applied to cutting members and wear parts and for more than 40 years, CVD (chemical vapor deposition) has been used for coating cutting tools, cutting members, and wear parts thereby improving their performance and effective working life.

It will be appreciated that some coatings and coating—substrate combinations favor themselves to one or other deposition process and there are host of materials for which only one or other process route is practicable.

Coatings of TiN, TiC and Ti(C,N) may be deposited onto appropriate substrates by reacting titanium tetrachloride with other gases, and removing the gaseous chlorides thus formed:

It will be appreciated that, over the years, other chemical vapor deposition routes have become available for deposition of TiN, TiC and Ti(C,N), and the titanium chloride processes described above are given by way of non-limiting example, only.

For example, MT (medium temperature) processing routes which tend to produce different microstructures, often having columnar grain structure are popular. For example:

other gases.

Figure 1:
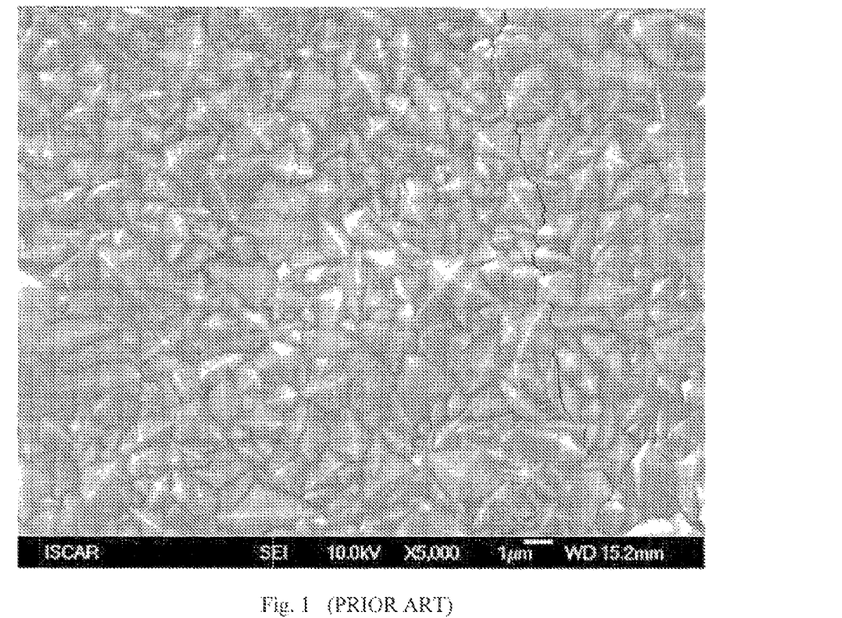
FIG. 1 is a SEM micrograph of the surface of a typical, prior art, MT-Ti(C,N) coating deposited by CVD.

With reference to FIG. 1, a scanning electron micrograph of the face of a typical MT-Ti(C,N) coating as deposited by CVD is shown. The coating typically presents a fine grained (1-3 micron) grain size on its face.

As the processing temperature increases, the substrate expands. On cooling, the substrate and coating contract and, if the contraction is at different rates, residual stresses result. It will be noted that the crack to the right of the micrograph is a typical consequence of thermal mismatch between the coating and the substrate. By lowering the process temperature, such cracking can be minimized. Where substrates contract more than coating on cooling, such cracks tend to be closed.

Figure 2:
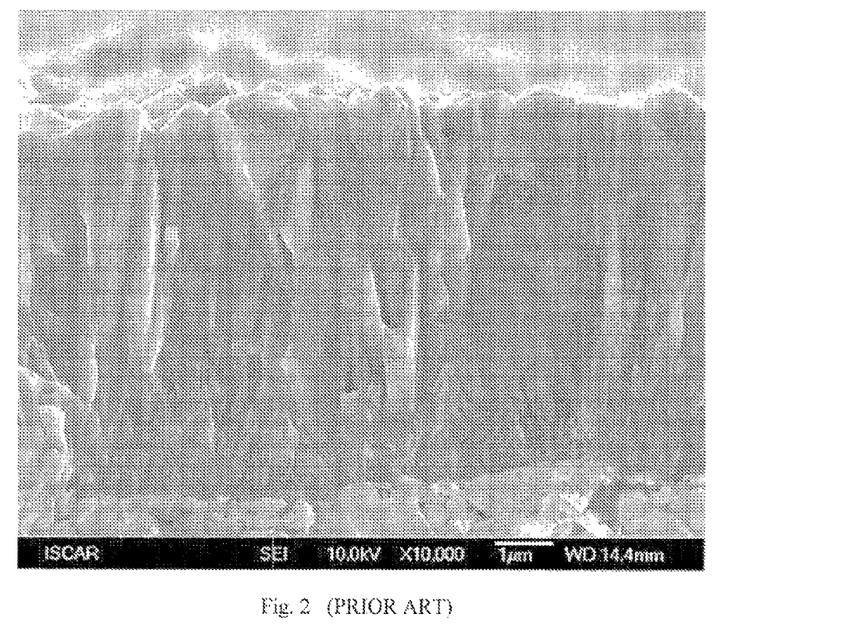
FIG. 2 is a SEM micrograph showing a sectional view through the coating of FIG. 1.

Examination of a section through such a coating shows that the microstructure consists of elongated crystals aligned through the coating thickness. This is due to the growth of seeded crystals aligned such that the preferred direction of growth lies through the coating thickness. Such coatings may be as much as 30 microns thick.

Cemented carbide made primarily of tungsten carbide optionally with the addition of other carbides in a primarily cobalt binder is by far the most popular substrate used for cutting tools. To prevent the cobalt binder reacting with the CVD gases used for depositing a wear resistant coating such as TiCN, a thin (0.1 μm to 1.5 μm) protective layer of TiN is generally deposited prior to the TiCN layer. The protective layer of TiN allows the tool bit to be subjected to the relatively harsh CVD conditions required for deposition of TiCN without decarburizing the substrate thereof, thereby minimizing the formation of undesirable, brittle η phases ($M_{12}C$, $M_6C$ where M is Co and W) being formed near surface of the substrate 12. EP 0 440 157 and EP 0 643 152 describe deposition of TiN under TiCN in this manner.

TiCN is preferred to TiN in many cutting tool applications since TiCN has better wear resistance and a lower coefficient of friction than TiN. Indeed, machining with a TiN surfaced cutting tool may result in very high temperatures being generated at which the coating may oxidize.

In the machining of hard materials, such as cast iron, for example, high temperatures are generated and even TiCN, and TiC may interact with the work-piece and/or with the cooling fluids and air.

One way of limiting workpiece—coating reactions is by alloying the coatings with silicon which tends to form dense oxides. Alloying with chromium or vanadium increases toughness and thus tool life when machining certain applications.

U.S. Pat. No. 6,007,909 to Rolander et al., entitled "CVD-Coated Titanium Based Carbonitride Cutting Tool Insert" relates to a cutting tool insert of a carbonitride alloy with titanium as the main component but also containing tungsten and cobalt. The cutting tool insert is useful for machining, specifically for the milling and drilling of metal and alloys. The insert is provided with a coating of at least one wear resistant layer. The composition of the insert and the coating is chosen in such a way that a crack-free coating in a moderate (up to 1000 MPa) compressive residual stress state is obtained. It is alleged that the absence of cooling cracks in the coating, such as that shown to the right of FIG. 2 and described hereinabove, in combination with the moderate compressive stress, gives the tool insert improved properties compared to prior art tools in many cutting tool applications. The alloying of the coatings with Ti, Al, Zr, Hf, V, Nb, Ta, Cr, Mo, W, Si or B to give solid solutions is discussed. The coatings are characterized as being free from cooling cracks, having a thickness exceeding 1 μm and a compressive residual stress at room temperature of 100-800 MPa. It will, however, be appreciated that using titanium based carbonitride as the substrate for machine tool inserts is a serious limitation. For regular cutting tools, WC—Co is the material of choice. Furthermore, although V, Cr and Si are suggested as possible alloying elements for addition to coating layers during CVD deposition, there is no further discussion of such coatings, and it does not appear that they were ever produced.

There is thus still a need for improved Ti based hard metal coatings and the present invention addresses this need.

SUMMARY OF THE INVENTION

In accordance with a first aspect of the invention, an improved coating—substrate combination for a substrate such as a cutting tool, a cutting member, or a cutting tool bit is presented.

In accordance with a second aspect of the invention, an improved coating—substrate combination for a wear part is presented.

Improved coating comprises at least one layer of titanium based hard material, such as TiCN, TiC, or TiN alloyed with at least one alloying element selected from the list of chromium, vanadium and silicon, wherein the total alloying element content is between 0.1% and 50% of the total metal content; the layer having a general formula of $(Ti_{100-a-b-c}Cr_aV_bSi_c)C_xN_yO_z$, where $x+y+z=1$ and $a+b+c>0$.

Typically at least 70% of the metal content is titanium.

Preferably, between 0.1% and 30% of the total metal content comprises at least one alloying element selected from the list of chromium, vanadium and silicon.

Optionally, between 0.1% and 30% of the total metal content in the layer is chromium.

Optionally, between 0.1% and 30% of the total metal content in the layer is vanadium.

Optionally, between 0.1% and 30% of the total metal content in the layer is silicon.

Optionally, said coating further comprises at least one layer of alumina deposited beneath or above the at least one layer of titanium based hard material.

The substrate may comprise a material selected from the list of high speed steel alloys, tool steels, carbon steels, low alloyed steels, super alloys, super hard materials, cements, stainless steels, oxide and nitride ceramics, cemented carbides Optionally the substrate is cemented carbide hard metal formed by sintering.

A third aspect of the invention is directed to providing a method of forming a coated cutting tool.

A fourth aspect of the invention is directed to providing a method of forming a coated wear part.

The method comprises the steps of:

(a) Obtaining a substrate fabricated from a selected material and having an appropriate geometry;

(b) Placing the substrate in a chemical vapor deposition reaction chamber;

(c) Depositing an alloyed coating layer of $(Ti_{100-a-b-c}Cr_aV_bSi_c)C_xN_yO_z$ where x+y+z=1 by chemical vapor deposition, and (d) Removing the coated substrate from said vapor deposition reaction chamber.

In one processing route, the step of depositing an alloyed coating layer of $(Ti_{100-a-b-c}Cr_aV_bSi_c)C_xN_yO_z$ comprises: reacting a mixture of metal halides and organo-metallics with gases selected from the list of nitrogen, hydrogen and methane.

Typically the metal halides are metal chlorides.

Typically the metal chlorides comprise titanium chloride and chlorides of alloying metals selected from the list of chromium chloride, vanadium chloride and silicon chloride.

Typically, at least 0.1% of the metal content of the coating is an alloying metal selected from the list of chromium, vanadium and silicon.

Typically partial pressure of titanium halide is at least 50% of the total partial pressure of metal chlorides in the CVD reaction chamber.

Preferably, the partial pressure of titanium halide is at least 70% of the total partial pressure of metal chlorides in the CVD reaction chamber.

Optionally, partial pressure of chromium halide is between 0.1% and 30% of the total partial pressure of metal chloride in the CVD reaction chamber.

Preferably, partial pressure of chromium halide is between 5% and 10% of the total partial pressure of metal chloride in the CVD reaction chamber.

Optionally, partial pressure of vanadium halide is between 0.1% and 30% of the total partial pressure of metal chloride in the CVD reaction chamber.

Preferably, partial pressure of vanadium halide is between 5% and 10% of the total partial pressure of metal chloride in the CVD reaction chamber.

Optionally, partial pressure of silicon halide is between 0.1% and 30% of the total partial pressure of metal chloride in the CVD reaction chamber.

Preferably, partial pressure of vanadium halide is between 5% and 10% of the total partial pressure of metal chloride in the CVD reaction chamber.

Typically, the method further comprises preparing the substrate by a process including at least one of degreasing, sandblasting and washing.

Optionally, the method further comprises depositing at least one previous coating layer prior to deposition of the alloyed coating layer.

Optionally, the method further comprises depositing subsequent coating layers onto the alloyed coating layer.

Optionally and preferably the alloyed coating layer is deposited at medium temperatures.

Optionally, between 0.1% and 30% of the metal content in the alloyed coating layer is chromium.

Optionally, between 0.1% and 30% of the metal content in the alloyed coating layer is vanadium.

Optionally, between 0.1% and 30% of the metal content in the alloyed coating layer is silicon.

Optionally, between 70% and 99.9% of the metal content in the alloyed coating layer is titanium and the alloyed coating layer comprises between 0.1% and 30% of alloying metals selected from the list of chromium, vanadium and silicon, with the alloyed coating layer comprising at least two of said alloying metals in said list.

Optionally, between 70% and 99.9% of the metal content in the alloyed coating layer is titanium and the alloyed coating layer comprises between 0.1% and 30% of alloying metals selected from the list of chromium, vanadium and silicon, with the alloyed coating layer comprising all three of said alloying metals in said list.

As used herein, the term "cutting tools" may include any tool that is used to remove material such as, for example metal, from a workpiece or to shape/manufacture a workpiece.

As used herein, the term "cutting members" or "cutting tool bits" may include any of the following: inserts, cartridges, cutting plates, solid carbides cutting heads, drills and end mills, etc. for working workpieces.

As used herein, the term "working" includes processes such as drilling, milling, cutting, turning and the like.

As used herein, the term "wear parts" may include parts such as molds, hot work tool steels, cold work tool steels, valves, blades, moving parts components used in applications where wear is a recognized problem. Wear parts may be for various wear applications such as, for example, machine parts, textile machine parts, ball bearings, roller bearings, moving parts in heat exchangers, turbo loaders, gas-turbine, exhaust valves, nozzles, manufacturing process dies for example for extrusion or wire drawing, punches, blanking tools, hot forging and pressing, molds, shear blades, plunger rods for pumps, plunger ball blanks, down hole pump check valve blanks, bushings, and other wear and impact applications.

BRIEF DESCRIPTION OF THE FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In the accompanying drawings:

FIG. 7b is a photograph showing the edge of a cutting tool coated with a MT-TiCN coating alloyed with silicon, and used for dry machining under identical conditions to those of FIG. 7a;

FIG. 14b is a photograph showing the edge of a cutting tool coated with a MT-TiCN coating that includes vanadium (sample 11), and used for dry machining under identical conditions to those of FIG. 14a;

DETAILED DESCRIPTION OF THE INVENTION

Coating optimization is a multifaceted and unpredictable issue. Although there have been breakthroughs in surface engineering the effect of different process parameters on the microstructure of coatings is not fully understood. Additionally, the complex interrelationships between the features of a coating's microstructure and its tribology are not properly comprehended.

The present invention is directed to cutting members, such as cutting tool inserts and the like, having novel coatings including at least one layer based on TiN, TiC or Ti(C,N) but modified by the inclusion of appreciable amounts of alloying metals such as one or more of chromium, vanadium and silicon. The novel coating layers thus formed have the general formula $(Ti_{100-a-b-c}Cr_aV_bSi_c)C_xN_yO_z$ where $x+y+z=1$ and display similar properties to TiN, TiC and Ti(C,N), i.e. are hard and tough, but, due to the alloying metals, typically have improved corrosion resistance and are thus less likely to react with the work-piece, cooling fluid or surrounding air.

The alloying elements may exist in solid solution and/or may be deposited as secondary phase within TiC, TiN or Ti(C,N) grains or along grain boundaries therebetween. Not only is the location of the dopant and the microstructural phases not fully understood. The relative partial pressures of titanium containing and alloy containing vapors in the reaction chamber during the CVD processes are known.

It is hypothesized that, as with simpler, better understood systems such as steels, metallic dopants or alloying elements within the crystal lattice of the host coating material, whether incorporated substitutionally or interstitially, tend to strain the lattice and retard slip mechanisms. Similarly, inclusions rich in the alloying element, whether deposited along grain boundaries or included within grains, will interfere with slip and have a hardening effect. Inclusions also retard crack propagation, deflecting cracks and thus tend to have a toughening effect. Consequently the alloyed coatings of the invention are typically harder and/or tougher depending upon alloying type than regular TiN, TiC and Ti(C,N) coatings of the prior art.

Whether or not the above hypothesis is true, experimental alloyed coatings with varying amounts of alloying elements were compared with non-alloyed TiN, TiC and Ti(C,N) coatings in various machining tests, under a variety of cutting tests on a variety of substrates. The positive effects of depositing coatings of TiN, TiC and Ti(C,N) alloyed with silicon, vanadium and chromium has been demonstrated.

The alloyed coating layers are deposited by chemical vapor deposition CVD, and may be up to 20 μm thick. This is significantly thicker than coatings practically achievable by PVD type technologies. Additionally, since the coating deposition is initiated by a chemical reaction occurring on the substrate (or underlying coating) surface, a strong chemical bond is formed, and the coating—substrate adhesion is typically higher than that achievable by PVD.

One route for depositing TiN, TiC and Ti(C,N) respectively is by reacting the titanium chloride with appropriate gases as follows:

$TiCl_4+N_2+H_2 \rightarrow TiN+$Chlorides and other gases.

$TiCl_4+CH_4+H_2 \rightarrow TiC+$Chlorides and other gases.

$TiCl_4+N_2+CH_4+H_2 \rightarrow TiCN+$Chlorides and other gases.

There are also MT (medium temperature) processing routes which tend to produce different microstructures, often having finer grain size, are popular. For example medium temperature Ti(C,N) may be fabricated as follows:

$CH_3CN+N_2+H_2+TiCl_4 \rightarrow MT\ Ti(C,N)+$Chlorides and other gases.

Typically the deposition temperature is between about 720-950° C. often called medium temperature or 'MT' and 950-1100° C. for high temperature 'HT' coatings.

It will be appreciated however, that, in addition to starting with titanium halide, other reactions routes are possible and will suggest themselves to persons of the art.

In the fabrication of coatings of the type $(Ti_{100-a-b-c}Cr_aV_bSi_c)C_xN_yO_z$ appreciable amounts of the nitrides and carbides of chromium, vanadium and/or silicon are co-deposited with TiN, TiCN and/or Ti(C,N). One way in which this co-deposition may be achieved is by the controlled addition of the halides of chromium, vanadium and silicon to the reaction chamber. Typically the chlorides of chromium, vanadium and silicon are added. Control of the partial pressures of the reactants and the reaction temperature provide a viable mechanism for affecting the composition and microstructure of the coatings thus formed.

Using moderate fabrication temperatures of around 900° C. or less lowers the stresses between the coating and substrate and minimizes cooling cracking phenomena. In general, the higher the deposition temperature, the more crystal growth is favored over seeding of new crystals, and coarser, columnar coatings result.

For optimizing cutting tools and cutting tool bits for specific applications, the coating layer of $(Ti_{100-a-b-c}Cr_aV_bSi_c)C_xN_yO_z$ may be combined with other coatings. For example, as explained hereinabove, TiN is not, itself, generally used as a wear resistant coating for machining tool bits, however it is often advantageous to deposit a thin (0.1 μm to 1.5 μm) protective layer of TiN prior to deposition of $(Ti_{100-a-b-c}Cr_aV_bSi_c)C_x$, $(Ti_{100-a-b-c}Cr_aV_bSi_c)C_xN_y$ or $(Ti_{100-a-b-c}Cr_aV_bSi_c)O_xC_yN_z$ since the relatively harsh CVD conditions required for the deposition of the $(Ti_{100-a-b-c}Cr_aV_bSi_c)C_x$, $(Ti_{100-a-b-c}Cr_aV_bSi_c)C_xN_y$, or $(Ti_{100-a-b-c}Cr_aV_bSi_c)C_xN_yO_z$ could otherwise decarburize the substrate leading to the formation of undesirable, brittle η phases ($M_{12}C$, $M_6C$ where M is Co and W) being formed near surface of the substrate which could lead to catastrophic failure by the coating flaking off, for example.

Although Ti(C,N) is particularly good at resisting flank and nose wear of cutting tool inserts, $Al_2O_3$ has been demonstrated as being generally more desirable on the rake face. The coating layer of $(Ti_{100-a-b-c}Cr_aV_bSi_c)C_xN_yO_z$ may advantageously be covered with a subsequent layer of alumina, for example; each coating layer providing effective protection against different types of wear.

Figure 3:
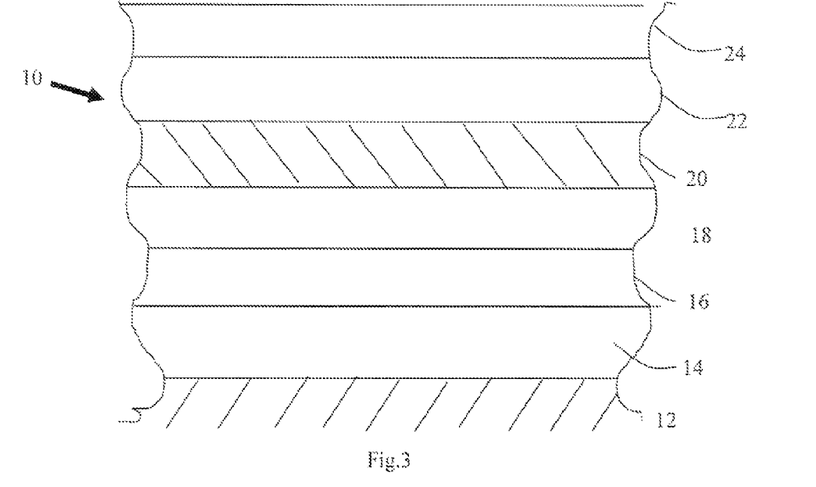
FIG. 3 is a schematic cross-section of one embodiment of the invention.

With reference now to FIG. 3 a schematic illustrative section of a cutting tool or cutting tool bit 10 is shown. Cutting tool bit 10 comprises a substrate 12 onto which various intermediate layers 14, 16, 18 are deposited, and an alloyed coating layer 20 of general formula $(Ti_{100-a-b-c}Cr_aV_bSi_c)C_xN_yO_z$ deposited thereon. Subsequent layers 22, 24 may then be deposited onto the alloyed coating layer 20.

The substrate 12 may be fabricated from a high speed steel alloy containing, in addition to iron and carbon, varying amounts of refractory metals such as chromium, tungsten, molybdenum and titanium, for example. Substrate 12 may include a super-hard material such as BN or diamond. Alternatively, substrate 12 may include a ceramic such as $Si_3N_4$, $Al_2O_3$, $Al_2O_3$/TiC, SiAlON, $Al_2O_3$/SiC whisker composite, and the like. More commonly, substrate 12 is a cement type composite such as TiC or TiN in a metallic binder. Most typically, however, substrate 12 is a hard metal cemented carbide type composite material, such as WC—Co or $Cr_3C_2$—NiCr that is generally fabricated by sintering. Indeed, tungsten carbide (WC) cemented by a metal matrix, usually Cobalt (Co) is the most popular choice for cutting tool bits.

Alloyed coating layer 20 has general formula $(Ti_{100-a-b-c}Cr_aV_bSi_c)C_xN_yOz$ and typically between 50% and 99% of the metal within the coating is titanium. However, a substantial amount, normally at least 0.1% and preferably at least 5%, of alloying metal, such as Cr, V and/or Si is included within the alloyed coating layer 20. Generally alloyed coating layer 20 includes between 0.1% and 30% of at least one alloying metal selected from the list of chromium, vanadium and silicon. Alloyed coating layer may include two or indeed all three of chromium, vanadium and silicon in varying proportions. Typically no more than between 30% and most typically no more than 10% (atomic percentages) of the total metal content is any one of the alloying species.

Figure 4:
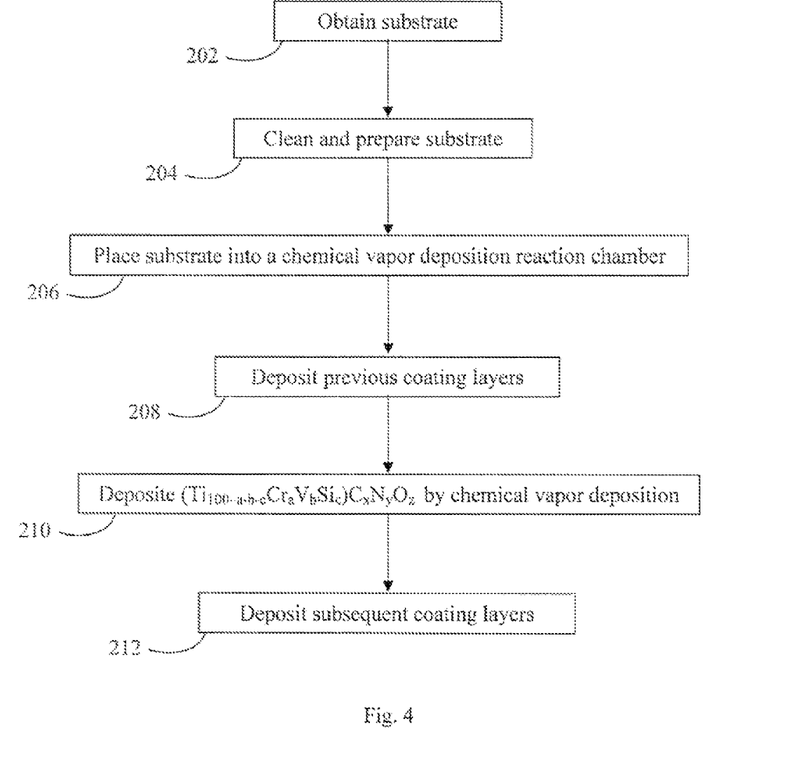
FIG. 4 is a flowchart summarizing a method for producing coatings of the invention.

With reference to FIG. 2, a method of fabricating cutting tool bits in accordance with the present invention is now described. Firstly, a substrate fabricated from a selected material and having appropriate geometry is obtained (Step 202). The substrate is prepared by a process including at least one of degreasing, sandblasting and washing. For example, the substrate may be cleaned in an ultrasonic bath of ethanol and then sandblasted with #400 alumina grit, thereby ensuring an active surface that is free from oxide scale, dirt and the like, for deposition of coatings thereupon (Step 204). The substrate is placed into a chemical vapor deposition reaction chamber (Step 206). Optionally, previous coating layers may be deposited, such as TiN for example (Step 208). An alloyed coating layer of $(Ti_{100-a-b-c}Cr_aV_bSi_c)C_xN_yO_z$ is then deposited by chemical vapor deposition (Step 210). This may perhaps be accomplished by reacting a mixture of titanium chloride or other halide with halides of alloying metals, such as chromium halide (typically chromium chloride), vanadium halide (typically vanadium chloride) and silicon halide (typically silicon chloride) and gases such as nitrogen, hydrogen and methane, for example.

Subsequent coating layers such as, for example, alpha, kappa or gamma alumina, TiN, TiC, Ti(C,N), TiAlCN, TiAl-CON, and or other $(Ti_{100-a-b-c}Cr_aV_bSi_c)C_xN_yO_z$ compositions may then be deposited thereupon (Step 212), with the optimal coating lay up being dependent on specific tooling requirements.

Control of both the composition and the microstructure of alloyed coating layer 20 may be achieved by selecting reaction temperature and appropriate partial pressures of the reaction gases during the chemical vapor deposition process. In general: (i) the ratio of partial pressure of titanium halide to halide of alloying metal and (ii) the fabrication temperature control the composition of the coating thus formed. In typical deposition processes of the invention, the partial pressure of titanium chloride is significantly more than the partial pressure of chromium, vanadium or silicon halide, and the ratio of titanium chloride to other halides in the coating is usually between 1:1 and 99:1.

The general reaction leading to the coating layer of the invention is as follows:

$TiCl_4+N_2+(SiCl_4, VCl_3, CrCl_2)+H_2 \rightarrow (Ti_{100-a-b-c}Cr_aV_bSi_c)N_y+$Chlorides and other gases.

$TiCl_4+N_2+CH_4+(SiCl_4, VCl_3, CrCl_2)+H_2 \rightarrow (Ti_{100-a-b-c}Cr_aV_bSi_c)C_xN_y+$Chlorides and other gases.

$TiCl_4+CH_4+(SiCl_4, VCl_3, CrCl_2)+H_2 \rightarrow (Ti_{100-a-b-c}Cr_aV_bSi_c)C_x+$Chlorides and other gases.

$TiCl_4+CH_4+(SiCl_4, VCl_3, CrCl_2)+N_2+CO_2+H_2 \rightarrow (Ti_{100-a-b-c}Cr_aV_bSi_c)C_xN_yO_z+$Chlorides and other gases.

$TiCl_4+CH_3CN+(SiCl_4, VCl_3, CrCl_2)+N_2+CO_2 \rightarrow (Ti_{100-a-b-c}Cr_aV_bSi_c)C_xN_yO_z+$Chlorides and other gases.

For each desired alloying element, the partial pressure of the halide is typically 0.1% to 30% of the total metal halide partial pressure. Alloyed coating layer 20 will typically be deposited at a temperature in the range of from about 720° C. for (MT type coatings) to 1100° C. or so (for HT type coatings). The amounts of each metallic species in the reactive atmosphere, i.e. the partial pressures of the reactant gases in the CVD deposition chamber, are not the same as the relative percentages of the metals in the coating. Nevertheless, control of the partial pressures during deposition does provide a means of controlling the composition of the resulting coatings.

PROOF OF CONCEPT EXAMPLES

To demonstrate proof of concept, thereby reducing the invention to practice, a series of coatings was deposited onto a CNMG 432 GN cutting member, as widely used for turning processes. The coated cutting members thus formed were used to machine a range of materials in different manners under a range of conditions.

Example 1

Si Alloying

After first depositing a protective layer of TiN to protect the substrate from the harsh reactive gases, thereby preventing decarburization of the substrate surface, three samples of Ti(CN) were deposited onto CNMG432GN hard metal substrates, to provide coated cutting tools as described in table 1. The first coating was not alloyed. During fabrication of the second coating, the partial pressure of Silicon chloride was such that 5% of the metal ions in the reactive mixture were silicon. In the third coating, 10% of the metal content of the reactive gases was silicon.

TABLE 1 compositions and thicknesses of coatings deposited onto CNMG 432 GN hard metal substrates.

| Coating No. | TiN | MT-Ti—Si CN | Relative proportions of Si to Ti in reaction gases | Total thickness (Microns) |
|---|---|---|---|---|
| | | Layers and their thickness (microns) | | |
| 1 | 0.5 | 7.9 | 0% | 8.4 |
| 2 | 0.4 | 7.3 | 5% | 7.7 |
| 3 | 0.7 | 8.1 | 10% | 8.8 |

For quality control and optimization purposes, a Vickers diamond was indented onto the coated face of the coated substrate, at an applied load of 20 Kg. The resultant indents were examined under an optical microscope for signs of cracking and delamination in and around the indent footprint. Where clear indents without cracking resulted, the coatings were considered as being well bonded to the substrate.

Figure 5:
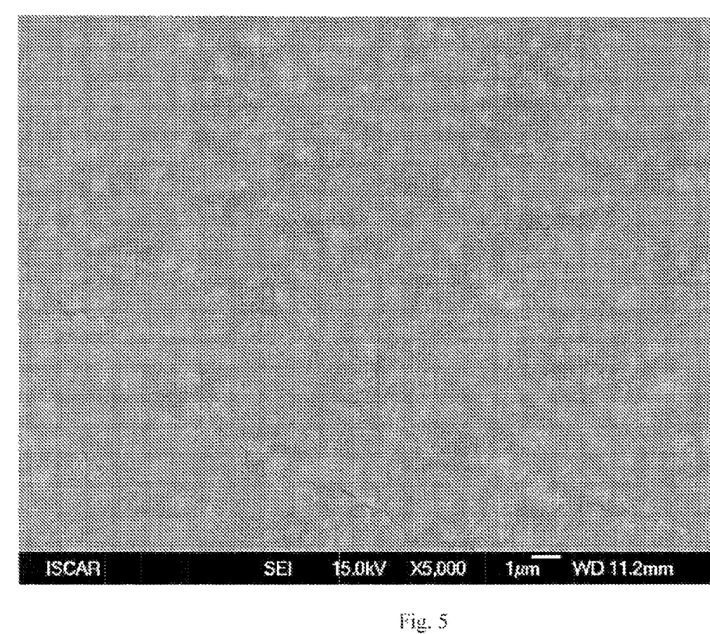
FIG. 5 is a SEM micrograph of the surface of an MT-(Ti—Si alloyed)C,N coating as deposited by CVD.
Figure 6:
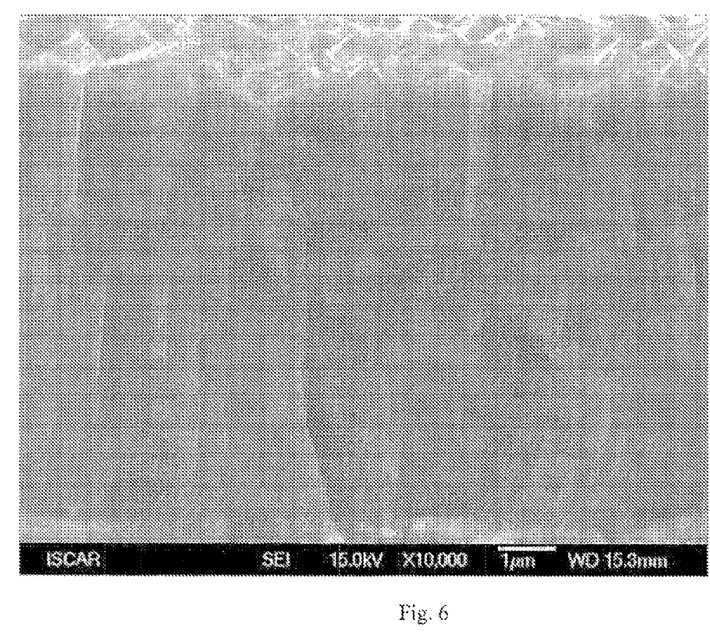
FIG. 6 is a SEM micrograph showing a sectional view through the coating of FIG. 5.

FIG. 5 and FIG. 6 are SEM photomicrographs showing the surface and section of coating number 3 of table 1.

The coated cutting tool inserts having coating layers as tabulated in table 1, were directly compared with each other by being used to machine SAE 1045 steel and gray Cast iron GG 25 under identical conditions.

For the continuous turning of steel SAE 1045, the cutting speed (Vc) was set to 250 m/min, the feed rate (f) was set to 0.20 mm/rev and the depth of cut (ap) was set to 2 mm. No coolant was used, and the cutting was performed dry, i.e. without using a lubricant. The experimentally determined tool lives for Coating Nos. 1, 2 and 3 were 22, 30 and 30 minutes respectively.

For the continuous turning of gray Cast iron GG 25, the cutting speed (Vc) was 100 m/min, the feed rate (f) was set to 0.2 mm/rev, the depth of cut (ap) was 2 mm, and the cutting was performed dry, without cooling fluids or lubricant. This time, the tool lives for coatings 1, 2 and 3 were 4.5 minutes, 7 minutes and 3.5 minutes respectively. These results are summarized in Table 2.

TABLE 2

Comparing empirically determined cutting tool lives for identical cutting tool inserts, coated with Ti(C, N) coatings that included varying amounts of silicon.

| | Machining test results | |
|---|---|---|
| Specimen Number | Continuous turning of steel SAE 1045 | Continuous turning of gray Cast iron GG 25 |
| 1 (no silicon) | 22 minutes | 4.5 minutes |
| 2 (less silicon) | 30 minutes | 7 minutes |
| 3 (more silicon) | 30 minutes | 3.5 minutes |

It will be appreciated that by comparing the behavior of different coatings under identical and realistic machining conditions in this manner, process parameters can be varied one-factor-at-a-time and their influence on the performance of cutting tools including such coatings can be accurately empirically assessed.

Figure 7A:
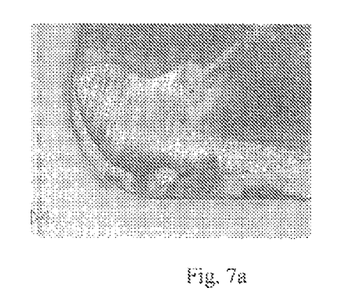
FIG. 7a is a photograph showing the edge of a cutting tool coated with a MT-TiCN coating and used for dry machining.
Figure 7B:
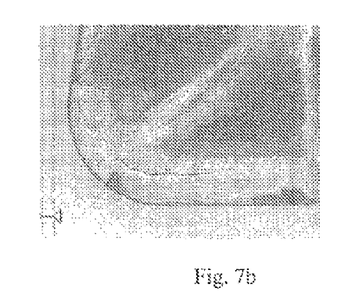

The worn cutting tool edges were examined in an attempt to quantify the types of wear occurring. It appears that the main advantage of using Ti(C,N) coatings alloyed with Silicon for machining SAE 1045 steel is that crater type wear is significantly reduced. The effect is demonstrated by comparing FIG. 7a where the worn surface MT-TiCN with 0% silicon is shown, to FIG. 7b showing the worn surface of the MT-TiCN coating including a relatively large amount of silicon, i.e. when reactive atmosphere during the deposition included 10% silicon. It will be appreciated that both coatings were subjected to identical machining conditions for identical periods of time.

Example 2

Medium and High Temperature (Ti—Si)C,N Coatings

A second comparative test was performed, wherein the performance of the cutting tool bit coated with (Ti—Si)C,N deposited by medium temperature chemical vapor deposition (sample 3 hereinabove) was compared with a cutting tool bit coated with a multilayer coating having a thin (Ti—Si)C,N medium temperature CVD layer covered with an alumina coating and coated with a TiCN or (T—Si)C,N high temperature CVD layer (sample 4). 10% of the metal in the reactive atmosphere during the CVD deposition was silicon, the rest was titanium.

A conventional TiCN coated cutting tool (sample 1) without silicon alloying was used as a control. In the fabrication of all three of these cutting member samples, a thin TiN barrier layer was first deposited onto the CNMG 432 GN substrate. The thicknesses of the various layers are summarized in Table 3.

TABLE 3 summarizing coating structure for three samples with varying alloyed silicon contents and fabricated at medium and high temperatures

| Coating No. | Layers and their thickness (microns) | | | | Relative proportions of Si to Ti in reaction gases | Total thickness (Microns) | Remarks |
|---|---|---|---|---|---|---|---|
| | TiN | MT-TiCN | Al$_2$O$_3$ | HT-TiSiCN | | | |
| 1 | 0.5 | 7.9 | | | 0% | 8.4 | Without alloying |
| 3 | 0.7 | 8.1 | | | 5% | 8.8 | MT-TiCN the alloyed layer |
| 4 | 0.5 | 3 | 3 | 4 | 10% | 10.5 | HT-TiSiCN the alloyed layer |

For the continuous turning of steel SAE 1045, the cutting speed (Vc) was set to 320 m/min, the feed rate (f) was set to 0.20 mm/rev and the depth of cut (ap) was set to 2 mm. No coolant was used, and the cutting was performed dry, i.e. without using a lubricant. The effective tool lives for Coating Nos. 1, 3 and 4 were 7, 9 and 11.5 minutes respectively.

A comparative, empirical, interrupted machining test was performed on a SAE 1060 steel work-piece. The cutting speed (Vc) was 93 m/min, the feed rate (f) was set to 80 mm/rev and the depth of cut (ap) was 3 mm. Once again, the cutting was performed dry, without lubricant or cooling fluid. This time, the tool lives for coatings 1, 3 and 4 were 7.5 passes, 6.5 passes and 16 passes respectively.

An interrupted chipping test was also performed on a SAE 4340 steel work-piece. The cutting speed (Vc) was 210 m/min, the feed rate (f) was set to 0.5 mm/rev and the depth of cut (ap) was 2 mm. this time, however, wet machining was used. The tool lives, defined as the length of the machined part to the exceeded cutting edge wear, for coatings 1, 3 and 4 were 102 cm, 102 cm and 204 cm respectively.

Figure 8:
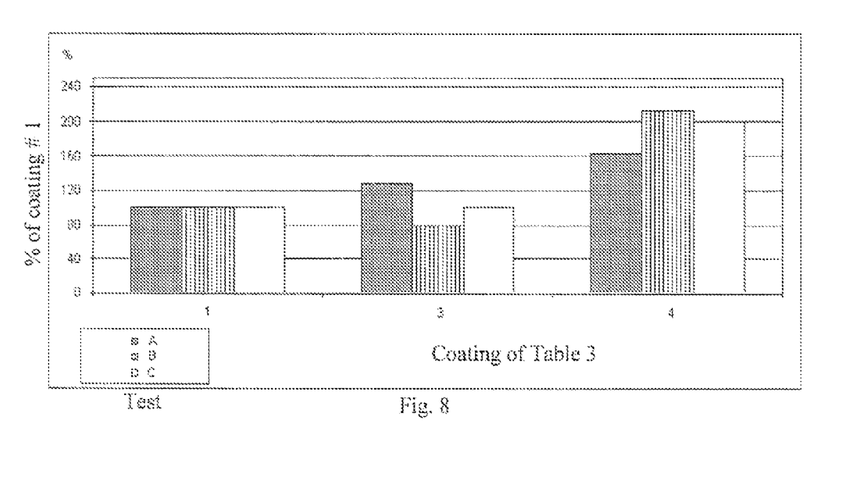
FIG. 8 is a bar chart showing comparative wear resistances of Ti(C,N) coatings with increasing amounts of alloying metal therein due to the relative partial pressures of 0-10% silicon in the reactant vapor.

The results of the comparative wear tests are summarized in FIG. 8 which are normalized, i.e. showing the results of the 3 tests as percentage performance of coatings 3 and coating 4 compared with the performance of coating 1 (Ti-0% Si) C,N. The results demonstrate effective working lives for identical cutting tool inserts coated with Ti(C,N) coatings that included varying amounts of silicon due to the relative partial pressures of 0-10% silicon in the reactant vapor.

The tests performed were:

Test A: continuous SAE 1045—320 dry/test 2;

Test B: strength, Walter test SAE 1060—93 dry/test 4; and

Test C: chipping test SA 4340—210 wet.

Although it will be appreciated that multilayer coatings must be considered as systems, and the effect of the penultimate layer of alumina is expected to contribute to the overall behavior of the coated tool bit, it can nevertheless be concluded that the (Ti—Si)C,N coating deposited at high temperature enables a significantly improved cutting tool performance with the work-piece, particularly for interrupted machining.

TABLE 4 comparing effective tool lives for alloyed (Ti—Si)C, N coatings with Ti(C, N) under empirical wear simulations

| Sample Number | Description | Continuous | Dry interrupted machining | Wet chipping |
|---|---|---|---|---|
| 1 | MT Ti C, N | 100% | 100% | 100% |
| 3 | MT (Ti—Si) C, N | 129% | 87% | 100% |
| 4 | Sandwich: MT(Ti—1Si)C, N Alumina HT (Ti—Si)C, N | 213% | 164% | 200% |

Example 3

Chromium Alloying

Coatings of titanium alloyed with chromium MT-(Ti—Cr) C,N were deposited onto hard metal substrates; specifically onto CNMG 432 GN cutting tool inserts as used for turning. In coating 1, no chromium was present in the reactive atmosphere, but in coatings 5 and 6, 10% of the metal in the reactive atmosphere during the CVD deposition was chromium Table 5 summarizes the coating structures formed.

TABLE 5 layer types and thicknesses for medium temperature and high temperature chromium alloyed coatings Layers and their thickness (microns)

| Coating No. | TiN | MT-TiCN | MT-(Ti—Cr)CN | HT-(TiCr)C | Relative proportions of Cr to Ti in reaction gases | Total thickness (Microns) |
|---|---|---|---|---|---|---|
| 1 | 0.5 | 7.9 | | | 0% | 8.4 |
| 5 | 0.5 | 3.5 | 4 | | 5% | 8 |
| 6 | 0.4 | 4 | | 3.8 | 10% | 8.2 |

It is noted that coatings 5 and 6 had intermediate layer of medium temperature TiCN deposited under the alloyed (titanium-chromium) carbide layer. In coating 5, the upper layer was deposited at moderate temperature of approx. 900° C., whereas in coating 6, the outer coating was deposited at a relatively high temperature of 1000° C.

Figure 9:
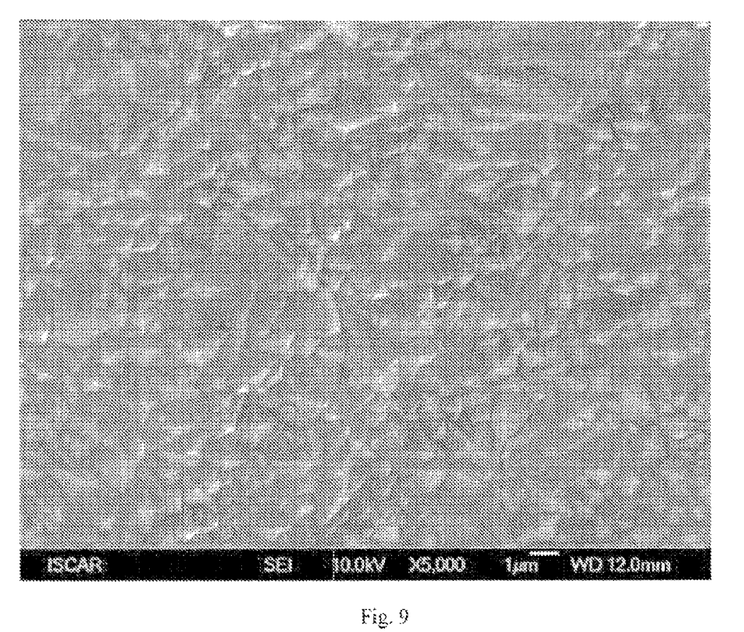
FIG. 9 is a SEM micrograph of an MT-(Ti—Cr)C,N coating as deposited by CVD from above.
Figure 10:
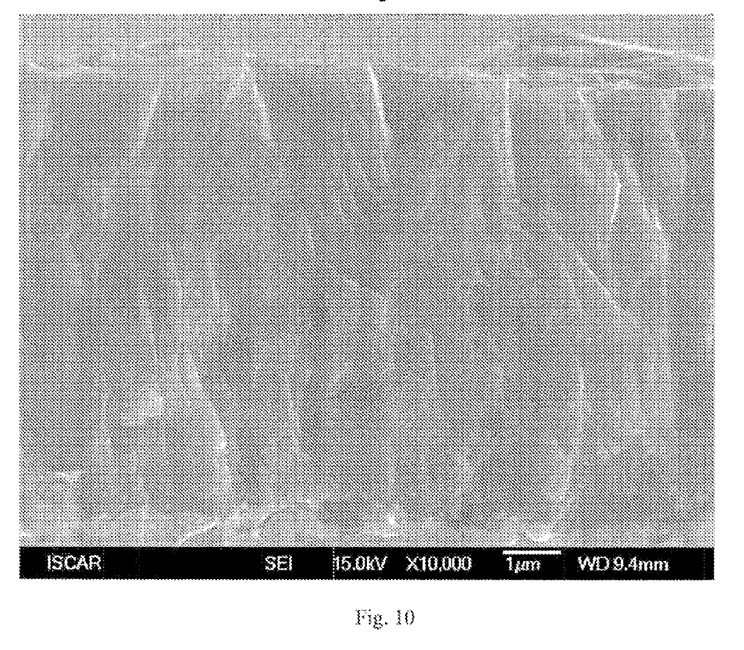
FIG. 10 is a SEM micrograph showing a sectional view through the coating of FIG. 9.

FIG. 9 and FIG. 10 are SEM photomicrographs showing the surface and section of coating 5, showing the double layer of MT-Ti(C,N) followed by MT-(Ti—Si)C,N.

As with the Ti(C,N) alloyed with silicon discussed above, the cutting tools with coated alloyed with Chromium were used to machine work-pieces under various conditions providing direct comparisons between the performance of the different coatings under different machining conditions as follows:

Test 1: Continuous (wet) turning of SAE 316 L

For the continuous turning of steel SAE 316 L, the cutting speed (Vc) was set to 300 m/min, the feed rate (f) was set to 0.20 mm/rev and the depth of cut (ap) was set to 2 mm. This time a coolant was used. The performance of both (Ti—Cr) CN and (Ti—Cr)C coated substrates (coatings 5 and 6) were 12 minutes and 14 minutes respectively, i.e. 20% and 40% better than the performance of TiCN without chromium, which lasted only 10 minutes. Both these coatings were deposited from a mixture of reactive gases including 105 Cr (percentage of metal in atmosphere by partial pressure).

Test 2: Interrupted dry machining test of steel SAE 1060

For the turning of steel SAE 1060, the cutting speed (Vc) was set to 93 m/min, the feed rate (f) was set to 80 mm/rev and the depth of cut (ap) was set to 3 mm. No coolant was used. The performance of both (Ti—Cr)CN and (T—Cr)C were 17.5 passes and 23 passes respectively, i.e. 233% and 307% better than the performance of TiCN which survived only 7½ passes.

TABLE 6 showing the effect on wear on the addition of chromium to Ti based coatings.

| Coating No. | Coating type | Continuous machining | Interrupted dry machining |
|---|---|---|---|
| 1 | Ti(C, N) | 100% | 100% |
| 5 | (Ti—Cr)CN | 120% | 233% |
| 6 | (Ti—Cr)C | 140% | 307% |

A further series of coatings were deposited to determine the effects of alloying TiC and TiCN with varying amounts of chromium and the effect of process temperature. The thickness and materials of the coating layers are summarized in Table 7.

TABLE 7 summarizing the thickness and materials of the coating layers of TiC and TiCN alloyed with chromium.

| | Layers and their thickness (microns) | | | | | |
|---|---|---|---|---|---|---|
| Coating No. | TiN | MT TiCN | HT TiCN | HT (Ti—Cr)CN | Relative proportions of Cr to Ti in reaction gases | Total thickness (Microns) |
| 1 | 0.5 | 7.9 | | | 0% | 8.4 |
| 7 | 0.5 | 1.8 | 5.4 | | 0% | 7.7 |
| 8 | 0.4 | 2.5 | | 5.2 | 5% | 8.2 |
| 9 | 0.3 | 2.3 | | 4.9 | 10% | 7.5 |

The coated cutting tool inserts were used to wet machine SAE 4340 steel in an interrupted fashion resulting in chipping type wear.

Figure 11:
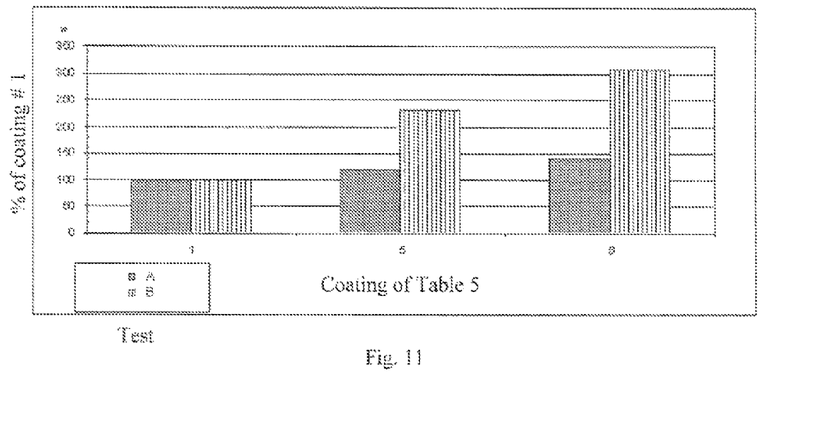
FIG. 11 shows empirically determined effective working lives for identical cutting tool insert substrates coated with Ti(C,N) and TiC coatings including increasing amounts of chromium, due to relative partial pressures of 0-10% chromium in the reactant vapor

FIG. 11 is a bar chart showing comparative wear resistances of Ti(C,N) coatings 1 and coatings 5 and 6 alloyed by the co-deposition and inclusion of chromium from a reactive gas mixture including 10% chromium by metal content. The cutting speed (Vc) was set to 210 m/min, the feed rate (f) was set to 0.15 mm/rev and the depth of cut (ap) was set to 2 mm. the machining was performed using a coolant. The tool life was defined as the length of the machined part to the exceeded cutting edge wear, and, using this definition, the Ti(C,N) coating (coating 1) had a tool life of 1.36 cm. Merely fabricating the Ti(C,N) coating at a higher deposition temperature (coating 7) increased the tool life to 1.53 cm which is a 12.5% increase, despite the overall coating thickness being 10% thinner.

The tests performed were

Test A: continuous SAE 316 L—300—wet; and

Test B: strength, Walter test SAE 1060—93 dry.

Figure 12:
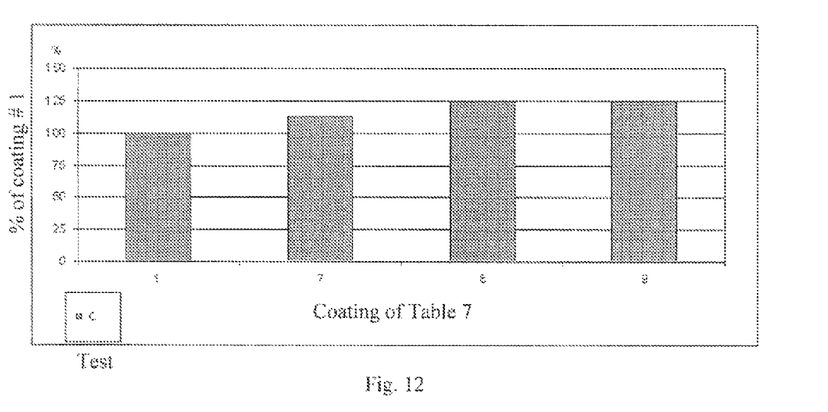
FIG. 12 is a bar chart showing comparative wear resistances of MT-Ti(C,N), HT-Ti(C,N), HT (Ti-lower chromium content)C,N and HT (Ti-higher chromium content)C,N coatings respectively.

Alloying with less and more chromium (partial pressures of reactive gases—5% Cr and 10% Cr respectively) increased the tool life to 1.7 cm, i.e. a 25% increase, despite the overall coating thickness being less, see FIG. 12 which shows comparative wear resistances (e.g. empirically determined effective working lives) of MT Ti(C,N), HT Ti(C,N), HT (Ti—Cr) C,N with less chromium, i.e. 5% partial pressure of chromium in the chemical vapor of the reactive gas, and HT (Ti—Cr)C,N coatings with more chromium, i.e. 10% partial pressure of Chromium containing gas in the reactive mixture. The coating Nos. 7, 8, and 9 were compared to coating No. 1 and the test C performed was and interupted chipping test SA 4340—210 wet test.

Example 4

Vanadium Alloying

Once again, coatings were deposited onto WC—Co cutting tool substrates. CNMG 432 GN hard metal substrate for turning was again used for all the experiments.

TABLE 8

| | Layers and their thickness (microns) | | | | |
|---|---|---|---|---|---|
| Coating No. | TiN | MT-TiCN | MT-(Ti—V)C | Relative proportions of Va to Ti in reaction gases | Total thickness (Microns) |
| 1 | 0.5 | 7.9 | | 0% | 8.4 |
| 10 | 0.5 | 4 | 4.5 | 5% | 9 |
| 11 | 0.4 | 3.5 | 5 | 10% | 8.9 |

Figure 13:
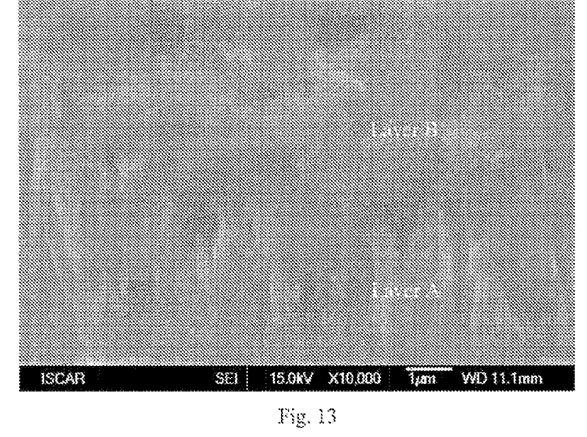
FIG. 13 is a SEM micrograph showing Ti(C,N) (layer A) with a characteristic columnar structure, followed by a vanadium alloyed coating layer (Ti—V)C,N (layer B) having a more equiaxed structure

With reference to FIG. 13, a SEM micrograph of a cross section through sample 11 is given. Note the moderate temperature coating Ti(C,N) coating (layer A) which has a columnar microstructure, followed by a second coating (layer B) containing significant, if indeterminate amounts of vanadium and having an equiaxed crystalline structure.

Test 1: Continuous (wet) turning of SAE 1045

A workpiece of Steel SAE 1045 was machined under continuous turning conditions by a Ti(C,N) coated cutting tool (coating No. 1) and by similar cutting tools coated with similar coatings but alloyed by the co deposition and inclusion of vanadium from a reactive gas mixture including 5% (coating no. 10) and 10% (coating no. 11) of vanadium by metal content.

Figure 15:
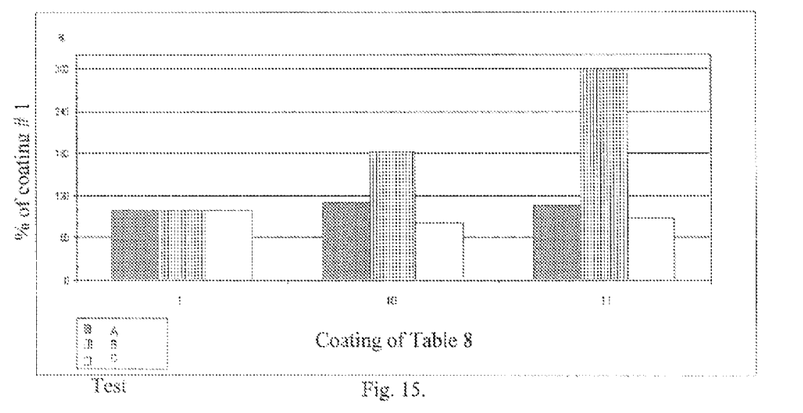
FIG. 15 is a bar chart showing comparative wear resistances of MT-Ti(C,N), MT (Ti-lower chromium content)C,N and MT (Ti-higher chromium content)C,N coatings respectively.

FIG. 15 is a bar chart showing the comparative wear resistances of the three coatings. The cutting speed (Vc) was set to 250 m/min, the feed rate (f) was set to 0.2 mm/rev and the depth of cut (ap) was set to 2 mm. No coolant was used. The tool life was given in time to failure, and using this definition, the Ti(C,N) coating (coating 1) had a tool life of 18 minutes. Coating 10 with a low vanadium content had a tool life of 20 minutes and coating 11 with a higher vanadium content, had a life of 19 minutes. It appears therefore, that alloying with vanadium increases the life of cutting tools under these machining conditions. The tests performed were:

Test A: continuous SAE 1045—250 m dry/test 2;

Test B: strength, Walter test SAE 1060—93 dry/tests 4 and 5; and

Test C: chipping test SA 4340—210 wet.

Figure 14A:
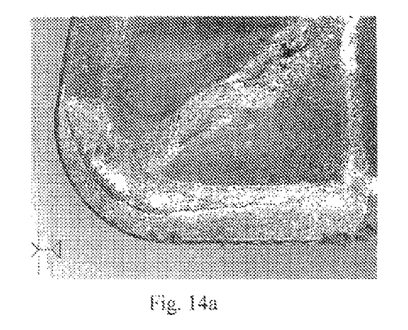
FIG. 14a is a photograph showing the edge of a cutting tool coated with a MT-TiCN coating (Sample 1) and used for dry machining for 8 minutes.
Figure 14B:
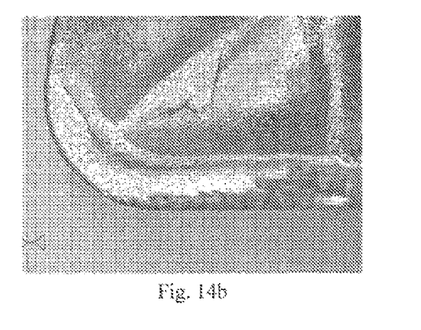

The coatings were examined after 8 minutes of continuous turning. FIG. 14a is an optical microphotograph showing the worn surface of a MT TiCN coated cutting tool (sample 1) and FIG. 14b is an optical microphotograph showing the worn surface of the MT (Ti—V)CN coating that included a relatively large amount of vanadium, i.e. when the reactive atmosphere during the deposition included 10% chromium halide vapors by weight (sample 11). It will be appreciated that both coatings were subjected to identical machining conditions for identical periods of time. Nevertheless, the crater wear is significantly reduced with the vanadium alloyed coating indicating that Vanadium alloying of MT TiCN reduces crater wear.

Test 2: Interrupted dry machining test of steel SAE 1060

For the turning of steel SAE 1060, the cutting speed (Vc) was set to 93 m/min, the feed rate (f) was set to 80 mm/rev and the depth of cut (ap) was set to 3 mm. No coolant was used. Coating 1 (TiCN) had a working life of 6 passes. Coating 10 had a working life of 11 passes and coating 11 had a working life of 18 passes. Clearly the alloying with vanadium provides significant benefits in interrupted machining of this type.

An interrupted chipping test was also performed on a SAE 4340 steel work-piece. The cutting speed (Vc) was 210 m/min, the feed rate (f) was set to 0.15 mm/rev and the depth of cut (ap) was 2 mm. This time, however, wet machining was used. The tool lives, defined as the length of the machined part to the exceeded cutting edge wear, for coatings 1, 10 and 11 were 102 cm, 85 cm and 90 cm respectively. It appears, therefore, that for interrupted chipping, the vanadium alloying was not advantageous.

The results of the comparative wear tests are summarized in FIG. 15 which are normalized, i.e. showing the results of the 3 tests as percentage performance compared with the performance of coating 1.

Examples of Substrate Coating Combinations for Wear Parts

The following examples utilize the coatings and methods of coating disclosed above upon different substrates by way of example that are intended for use as wear parts.

Example 5

Carbon Steel Base Low Alloyed Substrate Coating Combination

A coating for a carbon steel base low alloyed substrate, for example AISI 51100, comprising a first layer of HT-TiVCrN or MT-TiVCrN. One or more layers of any of coatings 2-11 described above may be deposited upon the first layer. These coatings are corrosion resistant and significantly reduce decarburization. The improved temperature shock resistance of this coating allows the coating and hardening oil hardening and or vacuum high pressure quenching steels. These coatings are excellent for applications such as, for example, ball bearings, roller bearings, type 51000 steels, or textile machine parts.

Example 6

Hot Work Tool Steel Substrate Coating Combination

Example 6A

A coating for a hot work tool steel substrate, for example AISI H13 with a first layer of HT-TiCN. One or more layers of any of coatings 2-11 described above may be deposited upon the first layer, particularly TiVCN coatings. These coatings are excellent for applications such as, for example, extrusion and wire drawing AlCu alloys, and steels.

Example 6B

A coating for a hot work tool steel substrate, for example AISI H13 with a first layer of HT-TiVCRN or MT-TiVCRN and a second layer of MT-TiCN. One or more layers of any of coatings 2-11 described above may be deposited upon the second layer. A top layer of CrTiSi(C,N) in combination with a columnar MT-Cr layer is excellent for tougher tools with improved heat checking resistance, and shock resistance especially for applications such as hot forging and pressing.

Example 7

Stainless Steel, Nickel and Cobalt Super Alloys Substrate Coating Combination

A coating for austenitic, terrific and martensitic stainless steels, for example AISI 316 or AISI 420, nickel and cobalt super alloys with a first layer of HT-TiVCrN or MT-TiVCrN followed by a second layer of MT-TiCN. One or more layers of any of coatings 2-11 described above may be deposited upon the second layer. These coatings are excellent for substrates for which alumina, especially thick layers of alumina, is difficult to apply. A layer of HT-Ti—Cr—Si—N significantly improves resistant to adhesive wear, high temperature wear, and oxidation. These coatings are excellent for applications such as, for example, moving parts in heat exchangers (fretting), turbo loader, gas-turbine applications.

Example 8

Cold Work Tool Steels or High Speed Steel Substrate Coating Combination

A coating for cold work tool steels, for example AISI D2 and for high speed steel, for example AISI M2 with a single layer of TiVCN. These coatings are excellent for applications such as, for example, cold forming of stainless steel. One or more layers of any of coatings 2-11 described above may be deposited upon the first layer.

Although it will be appreciated that multilayer coatings must be considered as systems, and the effect of the penultimate layer of (Ti-0%V)C,N is expected to contribute to the overall behavior of the coated tool bits, it can nevertheless be concluded that alloying with vanadium significantly improved cutting tool performance, particularly for interrupted machining.

The effect of the vanadium alloying of MT-TiCN is to change the coating grain structure to a less columnar grain structure. The biggest gains appeared to be a reduction of crater wear in continuous turning of Carbon Steel and an increase in coating and cutting edge strength.

Alloying with two or more metals selected from the list of silicon, chromium and vanadium and perhaps even more exotic materials such as molybdenum are expected to show similar properties. The effect is not expected to be additive, but, as with the long researched and far better understood alloyed iron-carbon system (steels), appropriate amounts of different alloying elements are expected to provide improvements in the properties such as hardness, corrosion resistance, etc., giving a longer working life to the cutting tools thus coated.

Generally, for reasons discussed above, alloying TiC, TiN and Ti(C,N) coatings with a second metal, such as silicon, vanadium or chromium will, in general, increase the toughness and other properties such as hardness, oxidation resistance, etc. of the coating to increase the life of the coated parts.

It has been demonstrated hereinabove that the addition of alloying elements such as Si, Cr, and V to Ti(C,N) type coating layers for cutting tool bits enhances the effective tool life of machine tools operating under a wide range of machining processes on a wide range of work-piece materials. It has further been demonstrated that such alloy coatings may be deposited by CVD.

Optimization for specific purposes is crucial. One factor at a time experimental methods are difficult to perform for complex processes but standard R&D techniques for quantifying the effect of incremental changes to process parameters, specifically deposition temperatures and the relative proportions of the various elements in the coating are expected to lead to improved coatings.

Thus the scope of the present invention is defined by the appended claims and includes both combinations and sub combinations of the various features described hereinabove as well as variations and modifications thereof, which would occur to persons skilled in the art upon reading the foregoing description.

What is claimed is:

1. A method of forming a coated cutting tool, cutting member or a wear part having a chemical vapor deposition (CVD) coating, comprising the steps of:
   (a) providing a substrate selected from the group consisting of high speed steel alloys, carbon steels, low alloyed steels, austenitic stainless steels, ferritic stainless steels, martensitic stainless steels, tool steels, cemented carbides, nickel and cobalt super alloys, oxide ceramics and nitride ceramics;
   (b) placing the substrate in a CVD reaction chamber, and
   (c) depositing, by CVD, an alloyed coating layer comprising CVD reaction products of: (c1) a titanium chloride; (c2) chromium chloride and optionally one or more of a vanadium halide and a silicon halide; and (c3) one or more of nitrogen, hydrogen and methane, such that:
   the alloyed coating layer has the general formula $(Ti_{100-a-b-c}Cr_aV_bSi_c)C_xN_yO_z$, where $x+y+z=1$, $a+b+c>0$, and $a$ is between 0.1% and 30.0% of total metal content.

2. A method of forming a coated cutting tool, cutting member or a wear part having a chemical vapor deposition (CVD) coating, comprising the steps of:
   (a) providing a substrate selected from the group consisting of high speed steel alloys, carbon steels, low alloyed steels, austenitic stainless steels, ferritic stainless steels, martensitic stainless steels, tool steels, cemented carbides, nickel and cobalt super alloys, oxide ceramics and nitride ceramics;
   (b) placing the substrate in a CVD reaction chamber, and
   (c) depositing, by CVD, an alloyed coating layer comprising CVD reaction products of: (c1) a titanium chloride; (c2) chromium chloride and optionally one or more of a vanadium halide and a silicon halide; and (c3) one or more of nitrogen, hydrogen and methane, such that:
   the alloyed coating layer has the general formula $(Ti_{100-a-b-c}Cr_aV_bSi_c)C_xN_yO_z$, where $x+y+z=1$, $a+b+c>0$, and $a$ is between 0.1% and 30.0% of total metal content; wherein
   the titanium chloride, the chromium chloride, the optional vanadium halide and silicon halide, and the one or more of nitrogen, hydrogen and methane, are reacted at a temperature of between 720° C. and 1100° C.

3. The method of claim 2, wherein the titanium chloride comprises titanium tetrachloride.

4. The method of claim 3, wherein a ratio of partial pressure of the titanium tetrachloride to partial pressure of any one or more of the chromium chloride and the optional vanadium halide and silicon halide is between 1:1 and 99:1.

5. The method of claim 3, wherein:
   the alloyed coating layer comprises CVD reaction products of at least titanium tetrachloride, chromium chloride and one or more of nitrogen, hydrogen and methane; and
   the partial pressure of chromium chloride is between 0.1% and 30% of total partial pressure of metal chloride in the CVD reaction chamber.

6. The method of claim 5, wherein:
   the alloyed coating layer comprises CVD reaction products of titanium tetrachloride, chromium chloride, nitrogen and hydrogen.

7. The method of claim 5, wherein:
   the alloyed coating layer comprises CVD reaction products of titanium tetrachloride, chromium chloride, nitrogen, methane and hydrogen.

8. The method of claim 5, wherein:
   the alloyed coating layer comprises CVD reaction products of titanium tetrachloride, chromium chloride, methane and hydrogen.

9. The method of claim 5, wherein:
   the alloyed coating layer comprises CVD reaction products of titanium tetrachloride, chromium chloride, methane, nitrogen, carbon dioxide and hydrogen.

10. The method of claim 5, wherein:
    the alloyed coating layer comprises CVD reaction products of titanium tetrachloride, chromium chloride, $CH_3CN$, nitrogen and carbon dioxide.

11. The method of claim 2, further comprising:
    preparing the substrate by a process including at least one of degreasing, sandblasting and washing, prior to depositing the alloyed coating layer.

12. The method of claim 2, further comprising:
    depositing, with CVD, at least one layer each of TiN and MT-TiCN, prior to depositing the alloyed coating layer.

13. The method of claim 2, further comprising:
    depositing, with CVD, at least one coating layer onto the alloyed coating layer, after depositing the alloyed coating layer.

14. The method of claim 2, wherein:
    the alloyed coating layer comprises CVD reaction products of titanium tetrachloride, chromium chloride, nitrogen, methane and hydrogen;
    $x>0$; and
    $y>0$.

15. The method of claim 2, wherein, in step (c), relative proportion of chromium to titanium in the CVD reaction chamber is at least 5%.

16. A coated cutting tool, cutting member or wear part made in accordance with the method of claim 1.

17. A method of forming a coated cutting tool, cutting member or a wear part having a chemical vapor deposition (CVD) coating, comprising the steps of:
    (a) providing a substrate selected from the group consisting of high speed steel alloys, carbon steels, low alloyed steels, austenitic stainless steels, ferritic stainless steels, martensitic stainless steels, tool steels, cemented carbides, nickel and cobalt super alloys, oxide ceramics and nitride ceramics;
    (b) placing the substrate in a chemical vapor deposition reaction chamber, and
    (c) depositing, by CVD, an alloyed coating layer of $(Ti_{100-a-b-c}Cr_aV_bSi_c)C_xN_yO_z$, where $x+y+z=1$, $x>0$, and $a$ is between 0.1% and 30.0% of total metal content, wherein:
    the CVD is carried out at a temperature in the range of 720° C. to 1100° C. by reacting a mixture of:
    (i) titanium tetrachloride, chromium chloride and optionally one or more of vanadium chloride and silicon chloride;
    (ii) either methane or $CH_3CN$; and
    (iii) at least one of nitrogen and hydrogen.

18. The method of claim 17, further comprising:
    depositing, with CVD, at least one layer each of TiN and MT-TiCN, prior to depositing the alloyed coating layer.

19. The method of claim 18, wherein:
    nitrogen is included in the mixture reacted in step (c);
    $x>0$; and
    $y>0$.

20. The method of claim 18, wherein, in step (c), relative proportion of chromium to titanium in the CVD reaction chamber is at least 5%.

21. A coated cutting tool, cutting member or wear part made in accordance with the method of claim 17.

* * * * *